(12) United States Patent
Ziauddin et al.

(10) Patent No.: US 10,480,314 B2
(45) Date of Patent: Nov. 19, 2019

(54) WELL TREATMENT

(71) Applicant: SCHLUMBERGER TECHNOLOGY CORPORATION, Sugar Land, TX (US)

(72) Inventors: Murtaza Ziauddin, Katy, TX (US); Ahmed S. Zakaria, College Station, TX (US); Hisham Nasr-El-Din, College Station, TX (US)

(73) Assignee: SCHLUMBERGER TECHNOLOGY CORPORATION, Sugar Land, TX (US)

( * ) Notice: Subject to any disclaimer, the term of this patent is extended or adjusted under 35 U.S.C. 154(b) by 550 days.

(21) Appl. No.: 14/787,481

(22) PCT Filed: Jul. 28, 2014

(86) PCT No.: PCT/US2014/048344
§ 371 (c)(1),
(2) Date: Oct. 28, 2015

(87) PCT Pub. No.: WO2015/013697
PCT Pub. Date: Jan. 29, 2015

(65) Prior Publication Data
US 2016/0076369 A1    Mar. 17, 2016

Related U.S. Application Data

(60) Provisional application No. 61/858,773, filed on Jul. 26, 2013.

(51) Int. Cl.
*G01V 99/00* (2009.01)
*E21B 49/00* (2006.01)
(Continued)

(52) U.S. Cl.
CPC .............. *E21B 49/008* (2013.01); *C09K 8/03* (2013.01); *C09K 8/42* (2013.01); *C09K 8/52* (2013.01);
(Continued)

(58) Field of Classification Search
None
See application file for complete search history.

(56) References Cited

U.S. PATENT DOCUMENTS 6,196,318 B1    3/2001    Gong et al.
2001/0006387 A1  7/2001  Bennis et al.
(Continued)

OTHER PUBLICATIONS

International Search Report and Writtin Opinion issued in PCT/US2014/048344 dated Nov. 14, 2014; 10 pages.
(Continued)

*Primary Examiner* — Ali Naraghi

(57) ABSTRACT

In one aspect, methods may include quantifying a pore-scale heterogeneity of a porous medium; determining an adjusted pore volume to breakthrough based on the pore scale heterogeneity determined; and designing a stimulating fluid treatment for the porous medium. Other aspects may include the development of a wellbore stimulation methodology that allows stimulation fluid breakthrough curves of differing formation samples to be plotted as a single curve that accounts for the varied pore structure of the respective samples.

20 Claims, 13 Drawing Sheets

(51) Int. Cl.
*C09K 8/60* (2006.01)
*E21B 43/25* (2006.01)
*C09K 8/03* (2006.01)
*C09K 8/42* (2006.01)
*C09K 8/52* (2006.01)
*C09K 8/74* (2006.01)
*G06F 17/16* (2006.01)
*G06F 17/50* (2006.01)

(52) U.S. Cl.
CPC ............... *C09K 8/60* (2013.01); *C09K 8/74* (2013.01); *E21B 43/25* (2013.01); *G06F 17/16* (2013.01); *G06F 17/50* (2013.01)

(56) References Cited

U.S. PATENT DOCUMENTS

| | | | | |
|---|---|---|---|---|
| 2003/0225521 | A1* | 12/2003 | Panga | E21B 43/16 702/6 |
| 2006/0184346 | A1* | 8/2006 | Panga | E21B 43/16 703/9 |
| 2009/0066327 | A1* | 3/2009 | Chen | G01N 24/081 324/303 |
| 2010/0161292 | A1* | 6/2010 | Shook | E21B 43/00 703/2 |
| 2010/0299125 | A1 | 11/2010 | Ding et al. | |
| 2014/0212006 | A1* | 7/2014 | Zhao | G06T 7/0004 382/109 |
| 2016/0025895 | A1* | 1/2016 | Ziauddin | G01V 99/005 702/11 |

OTHER PUBLICATIONS

McDuff et al., "Understanding Wormholes in Carbonates: Unprecedented Experimental Scale and 3-D Visualization", SPE International, SPE 134379, Sep. 2010, 9 pages.

McDuff et al., "Understanding Wormholes in Carbonates: Unprecedented Experimental Scale and 3D Visualization", JPT, SPE 129329, Oct. 2010, pp. 78-81.

Shuchart et al., "Advances in Carbonate Stimulation Methodology—From Wormholes to Long-Term Productivity", SPE International, SPE 138602, Nov. 2010, 8 pages.

Dong, C., Zhu, D., Hill, A.D.2002. Acid Penetration in Natural Fracture Networks.SPE Prod & Oper17(3): 160-170.

* cited by examiner

WELL TREATMENT

CROSS-REFERENCE TO RELATED APPLICATIONS

This application is a National Phase patent application of International Application No. PCT/US2014/048344 filed Jul. 28, 2014, which claims priority under 35 U.S.C. § 119(e) to U.S. Provisional Application Ser. No. 61/858,773 filed Jul. 26, 2013, which is incorporated by reference in its entirety herein.

BACKGROUND

The statements in this section merely provide background information related to the present disclosure and may not constitute prior art.

Wellbore stimulation is a widely practiced treatment method to enhance the production of hydrocarbons from oil or gas wells traversing subterranean reservoirs by removing near-wellbore formation damage or by creating alternate flow paths through the formation. Stimulation operations often involve injecting a stimulation fluid into an isolated treatment zone at pressures below the fracture pressure of the formation. In some instances, the injected fluid may extend the effective wellbore drainage radius by dissolving formation rock to form channels such as wormholes or remove formation damage induced during drilling operations. The purpose of such stimulation techniques is often to increase the production rate by increasing the near borehole equivalent permeability.

Wellbore stimulation methods may include hydraulic fracturing, acidizing, or a combination of both called acid fracturing. In hydraulic fracturing, the stimulation fluid may be referred to as fracturing fluid, while fluids used in acidizing the latter may be referred to as an acidizing fluid or simply as acid. In hydraulic fracturing, a fluid is pumped from the surface into a wellbore at a pressure and rate sufficient to open fractures in the rock. During acidizing treatments, the acid or acid mixture is injected from the surface into the reservoir to dissolve materials that impair well production or to open channels or wormholes in the formation. When combining both methods, it is the role of the acid to etch away from the surface of the fractures to prevent them from closing completely once the pumping pressure is released.

However, while stimulation treatments may be used to enhance the well productivity by creating alternative flow paths through isolated regions of the formation, computer modeling of flow path formation may be hindered by reservoir properties that have not been taken into account. For example, properties such as the pore-scale heterogeneity of carbonates may have certain effects on the movement of injected stimulation fluids into the formation as alternative flow paths are created.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

In one aspect, embodiments described herein are directed to methods that may include quantifying a pore-scale heterogeneity of a porous medium; determining an adjusted pore volume to breakthrough based on the pore scale heterogeneity determined; and designing a stimulating fluid treatment for the porous medium.

In another aspect, embodiments described herein are directed to methods that may include injecting a non-reactive tracer fluid through a porous medium, measuring a flowing fraction, estimating an adjusted pore volume to breakthrough based on the measured flowing fraction, and designing a stimulating fluid treatment for the porous medium.

In yet another aspect, embodiments described herein are directed to methods that may include determining a pore volume to breakthrough for a first porous medium having a first type of porosity; calculating a flowing fraction for a second porous medium having a second type of porosity; and determining an adjusted pore volume to breakthrough for the second porous medium by adjusting the pore volume to breakthrough for the first porous medium using the calculated flowing fraction for the second porous medium.

Other aspects and advantages of the embodiments disclosed herein will be apparent from the following description and the appended claims.

BRIEF DESCRIPTION OF DRAWINGS

These and other features and advantages will be better understood by reference to the following detailed description when considered in conjunction with the accompanying drawings.

DETAILED DESCRIPTION

Figure 1:
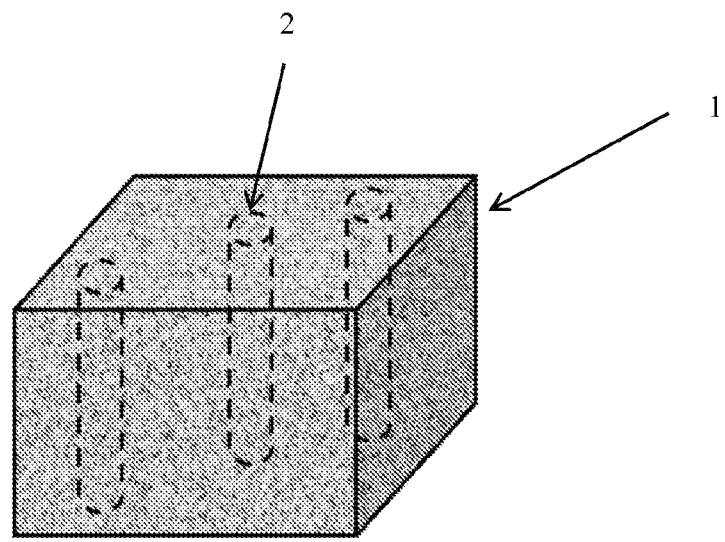
FIG. 1 is a graphical representation of the removal of cores from a section of rock.

For the purposes of promoting an understanding of the principles of the disclosure, reference will now be made to some illustrative embodiments of the current application. Like reference numerals used herein refer to like parts in the various drawings. Reference numerals without suffixed letters refer to the part(s) in general; reference numerals with suffixed letters refer to a specific one of the parts.

As used herein, "embodiments" refers to non-limiting examples disclosed herein, whether claimed or not, which may be employed or present alone or in any combination or permutation with one or more other embodiments. Each embodiment disclosed herein should be regarded both as an added feature to be used with one or more other embodiments, as well as an alternative to be used separately or in lieu of one or more other embodiments. It should be understood that no limitation of the scope of the claimed subject matter is thereby intended, any alterations and further modifications in the illustrated embodiments, and any further applications of the principles of the application as illustrated therein as would normally occur to one skilled in the art to which the disclosure relates are contemplated herein.

As used herein, the terms "treatment fluid" or "wellbore treatment fluid" are inclusive of "fracturing fluid" or "stimulating treatment" and should be understood broadly. These may be or include a liquid, a foam, a solid, a gas, and combinations thereof, as will be appreciated by those skilled in the art. A treatment fluid may take the form of a solution, an emulsion, slurry, or any other form as will be appreciated by those skilled in the art. It should be understood that, although a substantial portion of the following detailed description may be provided in the context of oilfield hydraulic fracturing operations, other oilfield operations such as cementing, gravel packing, etc., or even non-oilfield well treatment operations, can utilize and benefit as well from the disclosure of the present methods of formation treatment.

Moreover, the schematic illustrations and descriptions provided herein are understood to be examples only, and components and operations may be combined or divided, and added or removed, as well as re-ordered in whole or part, unless stated explicitly to the contrary herein. Certain operations illustrated may be implemented by a computer executing a computer program product on a computer readable medium, where the computer program product comprises instructions causing the computer to execute one or more of the operations, or to issue commands to other devices to execute one or more of the operations.

In one or more embodiments, the present disclosure is directed to developing models describing the flow of fluids through a porous medium that may have utility in designing stimulation treatments for subterranean formations. For example, models developed in accordance with the present disclosure may be used to aid matrix stimulation treatments that enhance hydrocarbon recovery for subsequent production operations.

One of the goals of wellbore stimulation is to remove or bypass formation damage that may be present in the near-wellbore region of the formation by creating high-conductivity flow channels. During stimulation treatments in hydrocarbon reservoirs, injection conditions of treatment fluids may control the resulting dissolution patterns produced in the formation that may vary in structure from uniform, conical, and wormhole types as new channels are created. The shape and structure of these channels may depend on a number of factors, including the type of stimulating fluid, the injection rate, the concentration of the active species in the stimulation fluid, the chemical kinetics of the reaction between stimulation fluid and the formation, and the thickness and permeability of the damaged zone.

Without being bound by any particular theory, it is believed that formation of stimulation-induced flow channels is governed, at least in part, by a competition of interrelated factors such as axial convection, transverse diffusion, and chemical reaction kinetics. At low injection rates, stimulating fluids such as acids may be spent after contact with the formation, resulting in face dissolution. At intermediate flow rates, long conductive flow paths may be formed that penetrate into the formation and facilitate the leak off formation fluids. As the injection rate increases to higher flow rates, stimulation fluid penetration may also increase, but reaction of the stimulation fluid with the formation may also occur over a larger area, which may result in dissolution patterns that are more uniform and less optimal for subsequent production operations.

Another parameter that may be useful during the design of formation stimulation treatments is pore-scale heterogeneity, the overall variance of the pore size distribution. Pore systems in formations and other porous media are made up of larger voids (pores), which may be interconnected by smaller voids (pore throats). Pore size is defined as the diameter of the largest sphere that can fit into a pore, while the pore throat size is defined as the diameter of the connections between the pores. Interparticle pore space may be visualized as rooms with connecting doors in which the "doors" represent the pore throats that connect the "rooms" or pores. Pore size may vary considerably depending on the type of formation, and even within a sample taken from a single formation. For example, carbonate formations may possess complex pore structure and exhibit multiporosity in which a single formation encompasses several pore types, e.g., interparticle porosity, microporosity, vuggy porosity, moldic porosity, etc., that are often categorized by size as micropores, mesopores, and macropores. Depending on the nature of the pore-scale heterogeneity of a given formation, the flow rate of treatment fluids through a formation at a given pressure can vary widely between well-connected pore systems and isolated pore systems with little pore-to-pore connectivity.

Experimental approaches to designing successful stimulation treatments may involve the use of destructive coreflood experiments on long reservoir cores to estimate the mobility of various stimulating fluids through a given formation, but such techniques may not be available for some wellbore operations in which access to cores or costs are an issue. Instead, it may be necessary to conduct coreflood experiments on carbonate reservoir analogs that may require considerable time and expense removing core samples and transporting them to the surface to gather enough measurements. Further, because coreflood testing with stimulating fluids is a destructive technique, a greater number of samples may be required to characterize a given formation accurately. Other approaches to designing stimulating treatments may include conducting theoretical studies using a digital reconstruction of a porous medium to estimate the optimum injection rate of stimulating fluids and calculate flow channeling, but such theoretical approaches may be based on assumptions that do not properly account for the role of fluid transport through the media prior to stimulation.

Non-Destructive Methods for the Design of Stimulation Treatments

In one or more embodiments, methods in accordance with the present disclosure may include analysis techniques that model reactive flows of stimulation fluids throughout a formation. In preparation for wellbore stimulation operations, the amount of stimulating fluid needed to treat a given formation may be determined from the pore volume to breakthrough (PVBT) of the sample for the selected stimulating fluid. PVBT is defined as the ratio of the volume of fluid injected to achieve channel breakthrough of the volume of the pore space in the core. However, PVBT measurements with reactive stimulating fluids are destructive and, when assaying to determining optimal injection pressure, concentration, and fluid type, for example, numerous formation samples may be required to develop a comprehensive set of PVBT curves.

For samples having heterogeneous pore sizes and connectivity, flow capacity (the total volumetric flow for a given flow path) may be higher relative to the storage capacity (the total volumetric flow for the total sample volume), which can indicate a reduced flowing fraction (f) due to the lack of pore connectivity through a given sample. The reduced flowing fraction may affect stimulating treatments in a number of ways. For example, in samples with poor connectivity, the reduced access of stimulating treatments to these regions of the formation may mean that stimulating treatments pass more quickly through a given formation when compared formations having well connected and homogenous porosity, with the end result that stimulation of the formation is incomplete and targeted hydrocarbon bearing regions are bypassed or inadequately stimulated.

The flowing fraction determined in accordance with the instant methods is the fraction of the sample containing interconnected pore space that participates in fluid transport of flowing media, as opposed to the unconnected pore space or "dead-end" pore space. In particular embodiments, the flowing fraction may be defined as the cumulative pore volume injected corresponding to the normalized tracer fluid concentration at $C/C_o=0.5$. As will be shown, the flowing fraction may be correlated with the PVBT for a porous sample and used to estimate a number of useful factors for preparing stimulation treatments, including selection of the type and concentration of stimulating fluid, and estimating the appropriate injection pressure and volume for treatment.

In one or more embodiments, PVBT curves previously obtained for a general rock type may be adjusted to account for the unique pore structure of a given formation by taking into account the fraction of the pore space of the sample that participates in fluid transport. For example, once an estimate of the flowing fraction for a porous sample is obtained from a number of possible porosity-characterization techniques, an adjusted PVBT curve can be generated that may account for the unique porosity for a sample, which can then be used to design stimulation treatments that minimize the amount of treatment fluids needed to achieve satisfactory stimulation of the assayed sample.

Once the flowing fraction and/or the porosity of the formation has been determined, the estimated PVBT curves of different carbonate rock types may be collapsed into a single curve by normalizing the PVTB for each sample by the respective flowing fractions measured. More specifically, the PVBT for different rocks may be recalculated based on the flowing porosity so that the PVBT curves of the carbonate rock types of different magnitude of pore-scale heterogeneity combine into one single curve, allowing an operator to optimize, for example, the concentration and injection pressure for a stimulating treatment. The inventors thus believe that determination of PVBT may be used for the design of the matrix stimulation treatments in carbonates.

Methods in accordance with the present disclosure may be useful in building a numerical model of reactive flows in a formation. Further, once a numerical model is developed, analysis using destructive techniques is no longer obligatory, as the same information may be obtained by determining the flowing fraction of the non-reactive tracer fluid alone. In other embodiments, an operator may validate the flow model on location by sampling cores of the target region by injecting a tracer to calculate the flowing fraction, then compare the obtained results with a previously generated numerical model. If differences are observed, the numerical model may be updated; on the other hand, if no differences are observed the operator may proceed with designing the stimulation treatment.

Determination of the Flowing Fraction

In particular embodiments, quantifying the pore-scale heterogeneity of a formation may be used to correlate the porosity-permeability relationship to the pore-scale heterogeneity of a formation and determine the flowing fraction. Specifically, the magnitude of pore-scale heterogeneity is inversely proportional to flowing fraction (f), in that, as the flowing fraction increases (such as the case when a sample exhibits homogenous pore structure), the magnitude of the pore-scale heterogeneity decreases.

Figure 2:
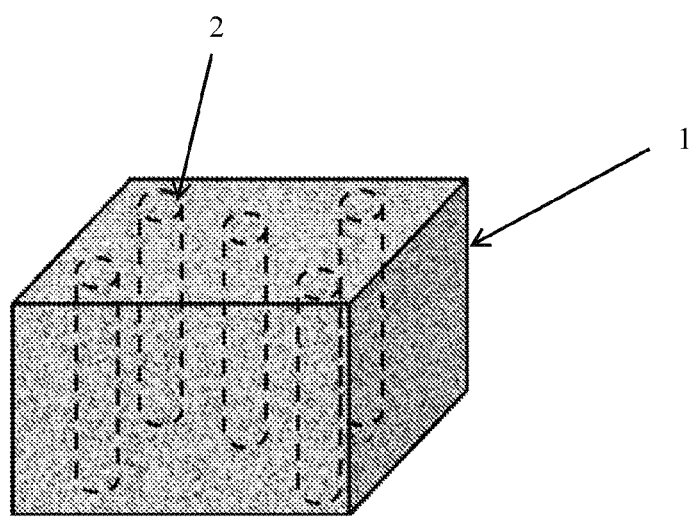
FIG. 2 is a graphical representation of a the removal of a large number of cores from a section of rock.

An example of an analytical approach to determine pore-scale heterogeneity is shown in FIGS. 1 and 2. A large block sample 1 from a formation of interest is collected. From the sample, a number of cores are extracted 2. Once obtained, the cores may then be used to study the effect of pore-scale heterogeneity on carbonate stimulation treatments; accordingly, analysis may be conducted to study the pore structure and elemental composition of the various rock types present in the formation.

Pore-scale heterogeneity may also be described by a number of relevant structural features such as the types of porosity, pore size, pore throat connectivity, and fabric and texture present in a given sample. In one or more embodiments, pore-scale heterogeneity may be quantified using a number of optical or fluorescent microscopy techniques. For example, in particular embodiments, a thin section of a core or other porous medium may be injected with a dye-containing epoxy and then examined via optical or fluorescent spectroscopy to determine, for example, the ratio of the sample that is occupied versus visible pore volume containing dye or other marker. Such techniques may provide insight into relevant factors such as pore size and pore throat and may be used alone or in combination with other techniques described herein to adjust an existing PVBT curve from a predetermined porous medium to account for differences in pore structure.

Methods for determining pore-scale heterogeneity may include, for example, optical microscopy techniques, x-ray computer tomography, mercury injection capillary pressure (MICP), and wireline techniques such as NMR relaxometry to generate a well length log of T2 measurements. While a number of methods are discussed, it is also envisioned that other techniques for quantifying the porosity of a porous medium known or developed in the art may be compatible with wellbore treatment methods of the instant disclosure.

In other embodiments, MICP may be used to quantify the pore-scale heterogeneity. Mercury porosimetry is based on the capillary law governing liquid penetration into small pores. Capillary forces in the porous medium are a function of surface and interfacial liquid tensions, pore-throat size and shape, and the wetting properties of the rock. The incremental mercury intrusion volume at a given pressure corresponds to the pore throat permeable to mercury at as given pressure, which provides a measure of overall pore size and connectivity.

In still other embodiments, a numerical flow model for porous medium or formation may be obtained by scanning a porous sample with computed tomography (CT) to create a 3D rendering of external and internal geometry, including pore space. In addition to pore structure and geometry, CT has also been used to calculate other relevant physical properties including absolute permeability, relative permeabilities, and capillary pressure for a given sample.

In addition, the porosity characterizations listed above may also be used to analyze the pore structure prior to stimulation treatment and, in some embodiments, may be followed by performing a stimulation treatment such as acidization and subsequently performing a CT scan of the stimulated cores to visualize the wormhole dissolution pattern.

In one or more embodiments, operators may use petrophysical logs or measurements to reduce or replace sampling of rock properties by coring. Petrophysical measurements compatible with the described methods may be used to estimate the flowing fraction and thus deducing an adjusted PVBT for a given rock type. Useful logs or measurements that describe elements of pore-scale heterogeneity may include wireline measures such as T2 response from NMR, a micro CT scans or logs, an SEM imaging, microresitivity logs generated using a formation micro-imager (FMI) tool, and combinations thereof.

NMR tools useful in accordance with the instant disclosure may generate continuous well logs once emplaced within a given formation. Measurements obtained from an NMR tool (such as $T_1$, $T_2$, $T_1/T_2$, and D) are proportional to the density of nuclear spins (i.e., protons) present in a given interval of the wellbore or sample. In addition, the NMR transverse relaxation time distribution (T2 distribution) is largely related to pore-size distribution in the rock sample, and to a lesser degree factors such as surface relaxivity and fluid type. The NMR logs obtained are therefore a measure of the porosity downhole, and may be converted to a NMR porosity log, by comparing the measured response for each fluid with the calibrated 100% porosity.

Once these logs are obtained and interpreted, the operator may then optimize and/or design a wellbore stimulation operation based on the results obtained. While calculating the PVBT by measuring the flowing fraction using non-reactive tracers may not always be possible, if such data are not available, an estimate of the PVBT may be obtained from several other rock properties that correlate with the fractional flow. For example, the distribution of pore throat radii may be used to estimate PVBT. While not bound by any particular theory, it is believed that, as the distribution of pore throat radii skews towards larger pores, the smaller the observed PVBT. This is believed to be due to the preferential flow of fluids thru the network of larger pores. Several methods for estimating the pore throat radii in accordance with methods described herein are available, such as mercury porosimetry (high pressure mercury injection), NMR T2 distributions, thin sections, micro CT images, or porosity and permeability relations.

Non-Reactive Tracer Fluids

In one or more embodiments, the flowing fraction of a porous sample may be estimated by injecting a non-reactive tracer fluid through the sample, determining a normalized tracer concentration from the sample effluent, estimating the residence time distribution of the tracer fluid to quantify the storage geometry of the flow paths, and determining the flowing fraction from capacitance models or experimental data. As used in accordance with this application, a non-reactive tracer fluid is a fluid containing a measurable species that may be used to simulate that flow of a stimulating fluid or other wellbore treatment fluid through a porous medium without damaging the sample or altering its chemical properties.

In one or more embodiments, the flowing fraction may be determined through a number of possible testing arrangements. For example, measurements may be conducted in laboratory-scale measurements by injecting a non-reactive tracer fluid through a sample of porous medium or core sample; or measurements may be obtained in the field by injecting a tracer fluid through the formation between an injection well and production well(s), or injecting the tracer fluid into a well and allowing the tracer to flow back into the injection well. Indeed, once the correlation between flowing fraction and PVBT is known, an operator may be capable of estimating a PVBT for a formation by flowing a suitable tracer through the area of interest, then by collecting it on a second "connected" well such as a production well, or by allowing it to flow back into the primary injection well. Thus, based on the flowing fraction measured, the operator will be able to design an optimized acidizing job to maximize fluid recovery from the estimated or "adjusted" PVBT.

Non-reactive tracer fluids in accordance with the present disclosure may be an aqueous fluid containing a detectable species such as an ion, isotope, or dye molecule by which an operator may identify when the tracer fluid has passed through sample and measured through a number of analytical techniques including, for example, inductively coupled plasma atomic emission spectroscopy (ICP-AES), gas chromatography, high pressure liquid chromatography, electrochemical detection, Fourier transform infra-red spectroscopy, UV-Vis spectroscopy, and fluorescence spectroscopy.

Examples of tracers compatible with the instantly described methods include ion-containing fluids such as brine containing for example potassium, sodium, lithium, magnesium, calcium, bromides iodides, etc.; fluids containing more complex salts such as nitrate, thiocyanate, fluorobenzoic acids, or hydrogen borates; enriched isotopic fluids such as deuterated or tritiated water; or tracer fluids containing colorimetric or fluorescent dyes such as rhodamine, cyanine dyes, or fluorescein.

In other embodiments, the tracer may be a gas injected through a sample such as $N_2$, or $CO_2$, sulfur hexafluoride, freons, deuterated hydrocarbons, noble gases such as He and Ar, perflurocarbons such as perfluorodimethylcyclobutane (PDMCB), perfluoromethylcyclopentane (PMCP), perfluoromethylcyclohexane (PMCH), 1,2- and 1,3-perfluorodimethylcyclohexane (1,2-/1,3-PDMCH). Tracer fluids in accordance with the instant disclosure may also include alcohols such as methanol, ethanol, and propanol; and hydrocarbon tracers such as propane, propene, butene, butane, and pentane.

In yet another embodiment, the tracer may a naturally occurring component of the target rock or reservoir fluids, including any of the aforementioned ions or detectable species, which is carried out of the sample or formation during the injection of non-reactive tracer fluid. Non-reactive tracer fluids may also include fluids that generate a tracer in situ by the reaction of an injected fluid with rock component or reservoir fluid downhole.

Further, depending on the desired stimulation fluid to be used in subsequent stimulation operations, the non-reactive tracer fluid may be modified with emulsifiers or viscosifiers to match the corresponding rheology of the active stimulating fluid. For example, non-reactive tracer fluids may be emulsified with an appropriate surfactant or mixed with rheology modifiers known in the art such as xanthan gums or polysaccharides. In one or more embodiments, the non-reactive tracer fluid may be an aqueous fluid, an emulsion, an invert emulsion, or a foam.

Stimulating Fluids

Stimulating fluids may be used in accordance with methods disclosed herein to remove or bypass formation damage by creating conductive channels or wormholes through a treated porous medium or formation. In one or more embodiments, prior to the initiation of a wellbore stimulation treatment, an operator may select a target stimulating fluid for a particular porous medium or formation and, on the basis of this selection, conduct preliminary tests on the porous medium or formation using a non-reactive tracer fluid having the same or nearly the same rheology as the stimulating fluid as a non-destructive surrogate.

Stimulating fluids that may be used in accordance with the present disclosure include acids of various concentrations. In one or more embodiments, suitable acids may include organic acids such as acetic acid, formic acid, citric acid, and the like; and mineral acids such as hydrofluoric acid, hydrochloric acid, hydrobromic acid, and the like. Mixture of acids can also be used in other embodiments. In one or more embodiments, the stimulating fluid may be an acid applied at a concentration that ranges from 5 to 28 percent by weight (wt %). However, one skilled in the art will appreciate this general range may be greater or lower in some embodiments depending on the chemistry of the stimulating fluid used (e.g., greater concentrations may be required for weak acids or chelant-containing stimulating fluids).

The reaction kinetics of the stimulating fluid with the porous medium or formation may be controlled in some embodiments through the injection rate, or through mass transfer by adjusting the concentration stimulating fluids. In other embodiments, the stimulating fluid may contain additional components that modify the rheology of the stimulating fluid or alter the speed of the chemical reaction of components of the stimulating fluid with the formation. In non-limiting embodiments, stimulating fluids may include viscoelastic diverting acids having a stimulating agent and a viscoelastic surfactant; self-diverting stimulating fluids prepared from a stimulating agent and various polymers; emulsified fluids such as a stimulating agent and oleaginous component that forms a second phase, e.g., an acid and hydrocarbon mixture; or alcoholic acids such as a mixture of an acid or other stimulating agent and methanol or isopropyl alcohols.

In another embodiment, chelating agents may function as a stimulating agent in a fluid injected as a fracturing or stimulating fluid. Chelating agents may stimulate a formation by means of sequestering the metal components of the carbonate matrix. Further, because the mechanism of interaction with the carbonate matrix is distinct from acid-based techniques, in some embodiments stimulation may be enhanced at low pH through the combined usage of acid and chelants. Possible chelants suitable for the described methods may include, for example, EDTA (ethylenediamine tetraacetic acid), diethylenetriaminepentaacetic acid (DTPA), citric acid, nitrilotriacetic acid (NTA), ethylene glycol-bis(2-aminoethyl)-N,N,N',N'-tetraacetic acid (EGTA), 1,2-bis(o-aminophenoxy) ethane-N,N,N',N'-tetraaceticacid (BAPTA), cyclohexanediaminetetraacetic acid (CDTA), triethylenetetraaminehexaacetic acid (TTHA), N-(2-Hydroxyethyl)ethylenediamine-N,N',N'-triacetic acid (HEDTA), glutamic-N,N-diacetic acid (GLDA), ethylenediamine tetra-methylene sulfonic acid (EDTMS), diethylene-triamine penta-methylene sulfonic acid (DETPMS), amino tri-methylene sulfonic acid (ATMS), ethylene-diamine tetra-methylene phosphonic acid (EDTMP), diethylene-triamine penta-methylene phosphonic acid (DETPMP), amino tri-methylene phosphonic acid (ATMP), and diethanolamine (DEA).

In one or more embodiments, stimulation fluids in accordance with the present disclosure may also include the use of retarded acids having reduced reactivity such that the acid penetrates deeper into the formation before being spent. In particular embodiments, emulsified acids may be used as a retarded acid source. For example, an acid or other stimulating agent may be contained within the internal phase of an emulsion, preventing contact of the stimulating agent with the formation and allowing delivery of the stimulating agent further into the formation. The external phase acts as a diffusion barrier to reduce the diffusion of the acid droplets to the surface of the rock which helps in the creation of deep wormholes. For example, the reaction rate of 28 wt % HCl emulsified acid with limestone is 8.5 times less than that of 28 wt % HCl with limestone. In embodiments in which the stimulating agent is present within an aqueous phase, the external phase may be a hydrocarbon or other oleaginous phase such as oil or diesel. Other approaches may include the use of stimulation foams, where, similar to the presence of an external phase, the presence of a gaseous phase in the foam acts as a barrier that prevents the stimulating agent species from spreading into the formation.

In some stimulation operations of the present disclosure, a solid acid-precursor can be used as a degradable material in the stimulating fluid. Suitable acid-generating materials can include for example, and without limitation, polylactic acid (PLA), polyglycolic acid (PGA), carboxylic acid, lactide, glycolide, copolymers of PLA or PGA, and the like and combinations thereof. Provided that the formation rock is carbonate, dolomite, sandstone, or otherwise acid reactive, then the hydrolyzed product, a reactive liquid acid, can etch the formation at exposed surfaces. This etching can enlarge the channels and/or remove smaller particles or gel from the interstices between proppant particles and thus further enhance the conductivity of the propped fracture. Other uses of the generated acid fluid can include aiding in the breaking of residual gel, facilitating consolidation of proppant clusters, curing or softening resin coatings and increasing proppant permeability.

In some embodiments of the disclosure, the solids in the treatment fluid may be formed of, or contain, a fluoride source capable of generating hydrofluoric acid upon release of fluorine and adequate protonation. Some non-limiting examples of fluoride sources which are effective for generating hydrofluoric acid include fluoroboric acid, ammonium fluoride, ammonium fluoride, and the like, or any mixtures thereof.

Treatment fluids in accordance with the present disclosure may also include, without limitation, friction reducers, clay stabilizers, biocides, crosslinkers, gas generating agents, breakers, corrosion inhibitors, and/or proppant flowback control additives. The treatment fluid may further include a product formed from degradation, hydrolysis, hydration, chemical reaction, or other process that occur during preparation or operation.

EXAMPLES

The following examples are provided to demonstrate various approaches to modeling porosity of a given formation, and their use in wellbore stimulation techniques.

Methods

Core Selection

Six cylindrical cores of 1.5-in. diameter and 6-in. length were drilled from each carbonate rock type. Six carbonate rock types were studied: Indiana Limestone, Austin Chalk, Edwards Yellow, Winterset, Pink Desert, and Edwards White. The 6 carbonates were mainly limestone and had different pore structures. The large blocks were obtained from Bedford, Edwards Plateau and Kansas formations respectively. The drilled cores were weighed dry and after saturation. Pore volume and porosity were determined from these measurements. Table 1 below lists the properties of the cores for each carbonate rock type used.

TABLE 1

Core Properties

| Rock Type | Pore Volume (cm³) | Porosity (vol %) | Permeability, (mD) |
|---|---|---|---|
| Indiana Limestone | 23-25 | 13-15 | 65 |
| Edwards Yellow | 32-38 | 18-22 | 53 |
| Austin Chalk | 25-35 | 14-20 | 22 |
| Winterset Limestone | 35-45 | 20-26 | 4 |
| Pink Desert | 40-48 | 23-28 | 82 |
| Edwards White | 32-37 | 18-21 | 3 |

XRF and XRD Analysis

In order to study the effect of pore-scale heterogeneity on carbonate stimulation treatments, X-ray diffraction was conducted to examine the mineralogy of the samples as shown in Table 2.

TABLE 2

XRF Data for the Carbonate Rock Types Used

| Mineral | Winterset | Indiana Limestone | Edwards Yellow | Pink Desert | Edwards White | Austin Chalk |
|---|---|---|---|---|---|---|
| Calcite | 89.1 | 98.6 | 99.1 | 98.5 | 99.1 | 98.9 |
| Dolomite | — | 0.7 | — | — | — | — |
| Quartz | 1.9 | 0.7 | 0.9 | 1.5 | 0.9 | 1.1 |

X-ray fluorescence analysis was also conducted to determine elemental composition of the carbonate rock types used. All studied carbonates are more than 98% calcite, almost the same composition and clean of clays. Therefore, the difference in their response to acid stimulation treatments is attributed to the difference in their respective pore structure. With reference to Table 3, the chemical composition for these carbonates is similar and the majority of surrounding clay has been removed, so the difference in their response to acid stimulation treatments is attributed to the difference in pore structure for each of the respective samples.

TABLE 3

XRF Data for the Carbonate Rock Types Used

| Element | Winterset | Indiana Limestone | Edwards Yellow | Pink Desert | Edwards White |
|---|---|---|---|---|---|
| Ca | 68.1 | 69.1 | 69.8 | 70.7 | 70.1 |
| O | 29.4 | 28.8 | 28.7 | 28.6 | 28.7 |
| Mg | 0.345 | 0.854 | 0.599 | — | — |
| Fe | 0.76 | 0.0584 | 0.164 | 0.113 | 0.272 |
| Si | 0.48 | 0.225 | 0.105 | 0.129 | 0.287 |
| K | 0.253 | 0.285 | 0.217 | 0.095 | 0.193 |

TABLE 3-continued

XRF Data for the Carbonate Rock Types Used

| Element | Winterset | Indiana Limestone | Edwards Yellow | Pink Desert | Edwards White |
|---|---|---|---|---|---|
| Al | 0.24 | 0.185 | 0.206 | 0.172 | 0.23 |
| Mn | 0.0553 | 0.012 | — | 0.0184 | 0.0125 |
| Cl | 0.156 | 0.275 | 0.146 | 0.0155 | 0.0327 |
| Sr | 0.154 | 0.0574 | 0.0606 | 0.0465 | 0.0663 |
| Sn | 0.0228 | 0.0224 | 0.026 | 0.0251 | 0.0237 |
| Ti | 0.0183 | — | — | — | — |
| S | — | 0.113 | — | — | — |

Thin Section Microscopy

In order to study the pore-scale heterogeneity, thin sections were impregnated with blue epoxy impregnated to obtain a detailed description of the types of porosity, pore connectivity, fabric, and texture of each of the samples. Thin sections were viewed under an optical microscope. Two images for each rock sample were captured under a magnification of 2.5× and 10× using a digital camera and then transferred to a computer.

High Pressure Mercury Injection

High pressure mercury injection capillary pressure (MICP) tests were performed on all carbonate rock types using the Micrometrics AutoPore IV 9520 mercury porosimeter. Mercury was injected at multiple pressures up to 60,000 psi. The volume of the mercury injected at each pressure increment was automatically recorded until the maximum pressure was achieved. The median pore throat diameter size is defined as the pore throat diameter at 50% of mercury intrusion during the experiment. Table 4 shows the median pore throat diameters for the carbonate rock types.

TABLE 4

MICP results for different carbonate rock types.

| Rock Type | Mercury Entry Pressure (psi) | Median Pore throat diameter (μm) |
|---|---|---|
| Indiana Limestone | 4.45 | 16.04 |
| Edwards Yellow | 12.69 | 6.95 |
| Austin Chalk | 33.90 | 1.64 |
| Winterset Limestone | 57.17 | 1.52 |
| Pink Desert | 18.15 | 6.44 |
| Edwards White | 67.49 | 1.11 |

Nuclear Magnetic Resonance Measurements

Nuclear magnetic resonance (NMR) experiments were performed using a MARAN low field (2 MHz) hydrogen magnetic resonance instrument. The T2 distributions were computed by evaluating the Carr-Purcell-Meiboom-Gill (CPMG) measurements. The inter-echo spacing used in these experiments was 600 μsec and the delay time was 10 seconds. The NMR of the fully brine saturated samples was measured in the included examples.

Non-Reactive Tracer Experiments

A tracer solution of 8 wt. % KCl (ACS Reagent, >99%) was used as a non-reactive tracer fluid. Prior to commencing the tracer injection, the core was saturated with deionized water under vacuum, and then preflushed with deionized water. Five pore volumes of the tracer was then injected at an injection rate of 5 cm³/min on each core sample before beginning the acidizing treatment. Fractions of effluent exiting the core were collected by switching test tubes and each sample was analyzed by inductively coupled plasma (ICP-AES) to determine the concentration of $K^+$ ions. The tracer concentration at each sample point was plotted versus pore volume injected. Tubing, fittings, and the caps volume was measured to eliminate dead volume effects on the tracer concentration profile. Tracer experiments were conducted on different cores for each carbonate rock type to select similar cores and represent each rock type with one single effluent concentration curve.

Pore Volume to Breakthrough Experiments with Acid Stimulating Fluid

Figure 3:
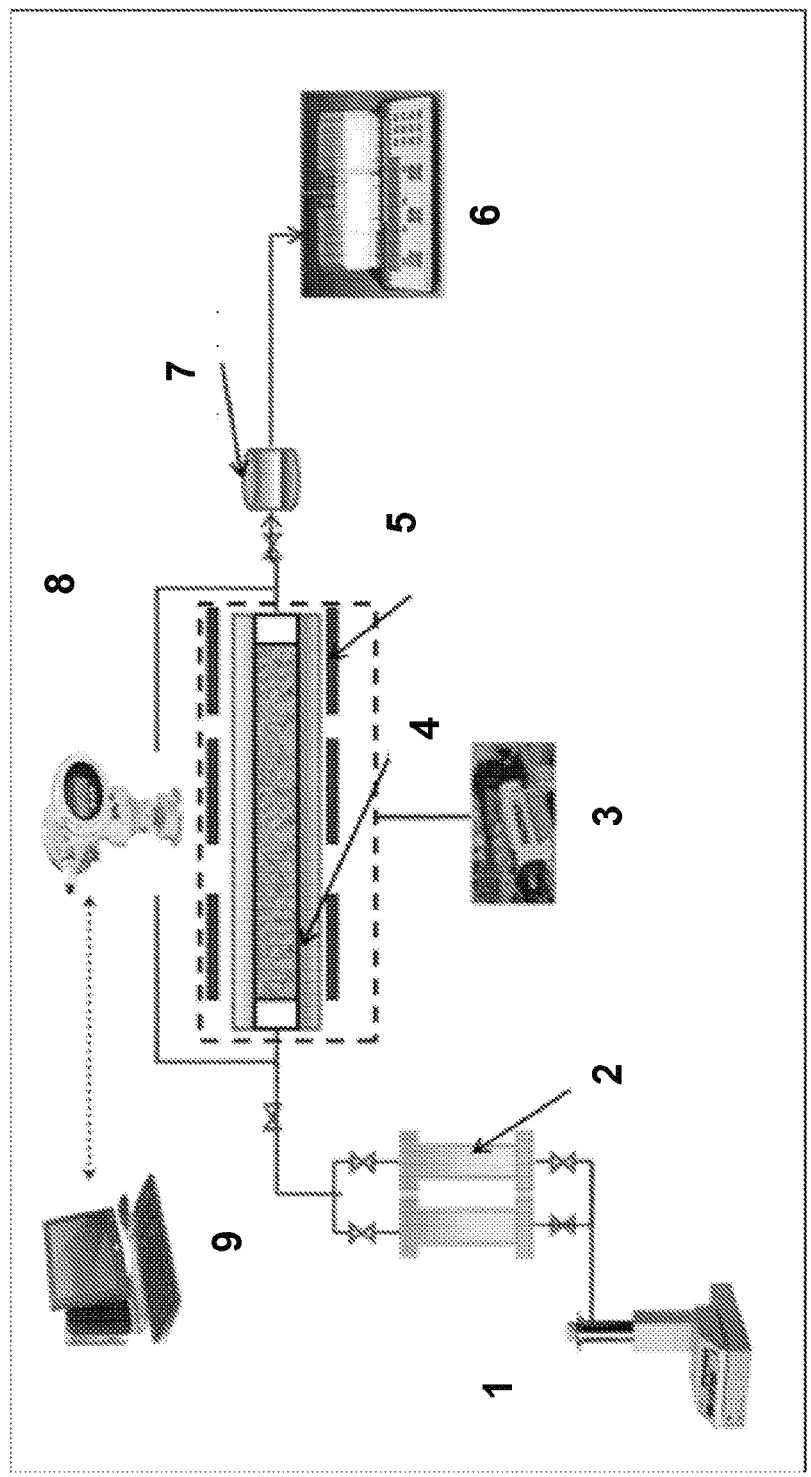
FIG. 3 illustrates an example of the coreflood setup used to analyze core samples.

FIG. 3 shows the schematic of the coreflood setup used. A pump 1 is used to drive fluids form the heated acid and water accumulators 2 through a core sample held by core holder 4. The core holder 4 also connected to an overburden pressure pump 3 and a heating system 5, and back pressure regulator 7. Effluent from the core sample is collected by fraction collector 6, which is later measured for presence of tracer. Pressure within the core holder is monitored buy a differential pressure transducer 8 and logged using data acquisition software 9.

Because PVBT experiments are destructive, the tracer experiments were conducted before acid injection. The coreflood setup includes a core holder, two accumulators, syringe pump, a hydraulic pump, and a differential pressure transducer to monitor the pressure drop across the core. A Teledyne ISCO D500 precision syringe pump, that has a maximum allowable working pressure equal to 2000 psi, was used to inject acid inside the core. A back pressure of 1100 psi was set to keep the $CO_2$ in the solution. Prior to commencing the acid injection, deionized water was injected at different flow rates at room temperature to measure the core permeability (Table 1). During injection, an overburden pressure at least 300 psi higher than the inlet pressure was kept to prevent the fluid bypass the core. The water injection continues during heating the system to 150° F. The 15 wt % HCl acid was then injected, and the pressure drop was monitored across the core until breakthrough was detected. The acid was injected at rates of 0.5, 1, 2, 5, and 7 $cm^3$/min. At breakthrough for each rate, the acid injection stops and deionized water was injected till reaching the stabilization.

X-Ray Computerized Tomography

Following acidization with 15% HCl, X-ray computerized topography (CT) scan measurements were made on the cores to determine the resulting wormhole dissolution pattern. In this technique, x-rays emitted from a source within the CT scanner are attenuated as they pass through a carbonate sample. The resolution of the obtained core image was approximately 250 microns.

Results

Thin Section

Thin section analysis was made for each rock type to examine the pore structure and pore-scale heterogeneities. Different point samples were imaged for each rock using optical microscope and images at 2.5× and 10× resolution were generated.

Indiana Limestone is a grainstone composed of predominantly pellets, moderately rounded skeletal grains, ooids and shell fragments. Skeletal diversity is good with common amounts of crinoids and bryozoans, algal grain, gastropods and pelecypods. Equant spary calcite crystals commonly cement the grains. The pore system is dominated by intergranular pores that seem well connected. Rare moldic pores are also noted in partially leached grains. Indiana limestone is characterized by high storage capacity and good permeability.

Pink Desert is a good example of mixed fossil grainstone that has undergone moldic dissolution followed by calcite cement fill. The pore structure is dominated by moldic porosity, and consequently it is not a well connected as in Indiana Limestone. Calcite cement fills the primary intergranular pores and some of the moldic porosity.

Edwards Yellow is skeletal grainstone. The pore system is composed of moldic porosity formed by leaching of fossils and intergranular porosity. Such rock had good moldic pores connectivity through the intergranular porosity.

Winterset is an oolitic grainstone that has undergone complete porosity inversion by leaching of original ooids and forming moldic porosity. The diagenesis led to complete filling of the primary intergranular porosity by blocky sparite calcite cement. Although porosity remained high, permeability was substantially reduced because the moldic pores are poorly connected. Winterset limestone is characterized by high storage capacity and low permeability.

Edwards White is a good example of a planktonic foraminiferal limestone. It has poorly sorted packstone texture and is predominantly composed of intraclasts, micritized grains, pelecypods, ostracods, ooids and micritized skeletal fragments. Moldic porosity is the dominant pore system by leaching forams with fewer intergranular pores. The limestone had a dominant micritic matrix that fills most of the intergranular pores and some of the moldic pores. Edwards White is characterized by high storage capacity and low permeability.

Austin Chalk is a grainstone composed of pelloids, skeletal grains, and ooids. The grains are cemented by equant calite spar cement. Intergranular porosity is the dominant pore system while some moldic and micropores were formed in partially leached grains.

Tracer Experiments

Figure 4:
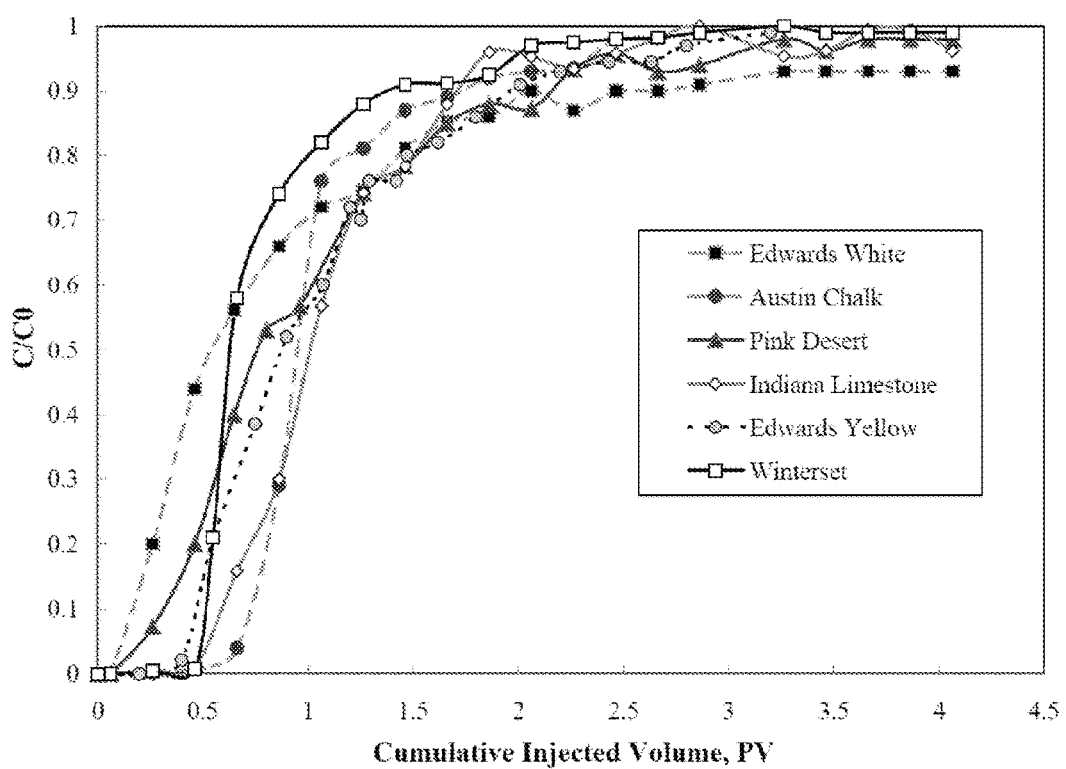
FIG. 4 shows tracer concentration profiles for a selected number of carbonate rock types.

The normalized tracer concentration ($C/C_0$) in the core effluent samples for different carbonate rock types is plotted as a function of the cumulative pore volume injected (FIG. 4), where C is the tracer concentration of the core effluent sample in mg/L, and $C_o$ is the tracer concentration at the core inlet in mg/L.

For Indiana limestone carbonate rock type, the tracer concentration profile was found to be symmetrical about $C/C_0=0.5$ at one pore volume injected, i.e., conservation of mass was observed. These results are expected because carbonates of well-connected intergranular pores exhibit a symmetrical profile around 1 pore volume (PV) injection at $C/C_0=0.5$. The tracer profile is dominated by low fraction of inaccessible pores and no capacitance effect (no dead-end porosity).

For other carbonate rock types, the porosity is not as well connected as for Indiana limestone carbonate rock type. Consequently, it is believed that the fluid flows in a smaller fraction of the pore volume in these carbonates than in well-connected Indiana limestone. The tracer concentration profiles that show an early breakthrough confirm this hypothesis and appear 1 ent with the observation of thin sections.

Residence time distribution (RTD) analysis was used to describe the flow and storage geometry of flow paths. To obtain RTD function (E(t)), the normalized tracer concentration is differentiated as follows in Eq. 1.

$$E(t) = \frac{d}{dt}\left[\frac{C(t)}{C_0}\right] \quad 1$$

Figure 5:
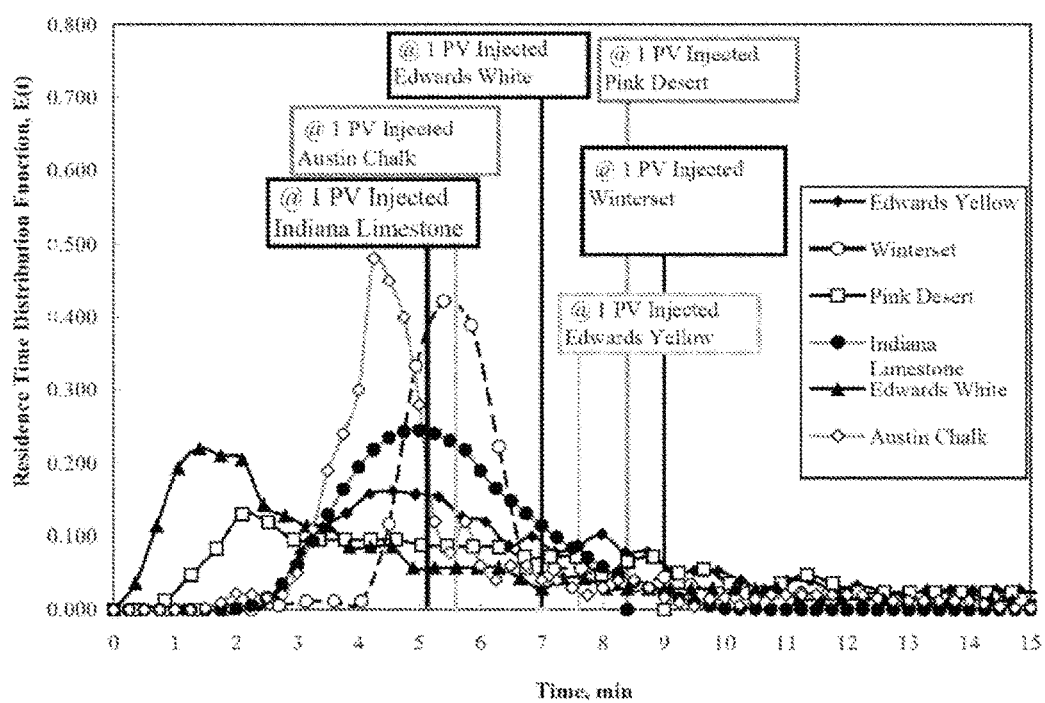
FIG. 5 shows the residence time distribution functions for a selected number of carbonate rock types.

FIG. 5 shows the computed residence time distribution function for different carbonate rock types. For Indiana limestone, the principal peak occurs at the space time corresponding to one pore volume injected. For other carbonates, the peak occurs at time smaller than the space time, which indicates rapid exit of the tracer (an indication that the effective pore volume contribution to flow is smaller than the measured pore volume).

If the flowing fraction is not available for a given rock type, other methods of quantifying pore-scale heterogeneity may be used in addition to the experimental and theoretical techniques discussed above. In the following example, the pore-scale heterogeneity is quantified by correlating the flow capacity of a pore structure with the storage capacity.

Flow capacity of a given flow path is defined as the fraction of the total volumetric flow that is associated with that flow path; storage capacity is the fraction of the total pore volume (PV) associated with it. The flow capacity function (F(t); Eq. 3) and storage capacity function ($\varphi$(t); Eq. 2) are cumulative distribution functions of the individual flow path properties.

$$\varphi(t) = \frac{\int_0^t E(t)t\,dt}{\int_0^\infty E(t)t\,dt} \qquad 2$$

$$F(t) = \frac{\int_0^t E(t)\,dt}{\int_0^\infty E(t)\,dt} \qquad 3$$

Figure 6:
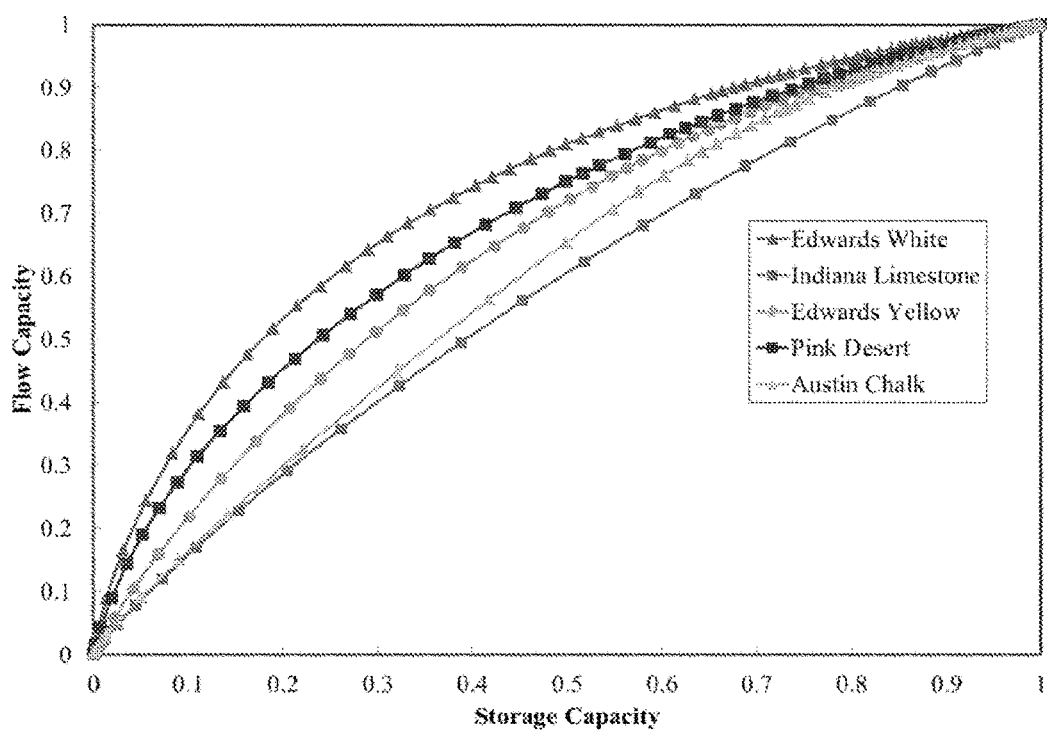
FIG. 6 illustrates flow-storage capacity curves for a selected number of carbonate rock types.

An example of a flow capacity v. storage capacity (F-$\varphi$) diagram is given in FIG. 6; from the plot, one can note that for Indiana limestone characterized by well-connected intergranular porosity, the F-$\varphi$ curve indicates homogenous travel path distribution. For other carbonate rock types, where the porosity is not well connected, a heterogeneous flow path distribution exists. For example, for Edwards white, 70% of the flow is coming from only 35% of the PV—an indication that the tracer-containing fluid only passes through a minor fraction of the pore volume.

The greater the deviation of sample plotted as flow capacity against storage capacity from the 45° line the greater the heterogeneity of the system. In one or more embodiments, the Lorenz coefficient may be used to quantify the departure from the 45° line (or the relative measure or heterogeneous permeability). The coefficient is derived by doubling the area above the 45° line bounded by the curve. The Lorenz coefficient varies from 0 to 1, where homogenous permeability is 0. The Lorenz coefficient may also be computed by porosity and permeability logs for a reservoir flow unit in some embodiments. Thus, the pore-scale heterogeneity may be estimated from the Lorenz coefficient for a given rock. Note that in the case of homogeneous permeability, the Lorentz coefficient is equal to 0, while the flowing fraction f is equal 1.

Similarly, other measures for quantifying the pore-scale heterogeneity of a reservoir exist, such as Dykstra-Parsons coefficient, reservoir quality indicator, etc. It is envisioned that, with the guiding principle that quantifying the pore size and connectivity of a given formation may be used to adjust an estimated PVBT based on the predicted flow of a stimulating fluid, one skilled in the art would empowered with the ability to adapt such measurements to the disclosed method.

Quantification of the Magnitude of Pore-Scale Heterogeneity

As introduced above, the magnitude of the pore-scale heterogeneity is inversely proportional to the flowing fraction. Specifically, as the flowing fraction increases (trending to more homogenous pore structure), the magnitude of the pore-scale heterogeneity decreases. Pore-scale heterogeneity may be attributed to, for example, differences in pore connectivity, variation of porosity types, diversity of the size and shape of pores, and changes in the rock fabric and texture. However, thin sections may only provide qualitative information about pore-scale heterogeneity in a given rock sample or formation.

In particular embodiments, quantifying the pore-scale heterogeneity of a formation may be used to correlate the porosity-permeability relationship to the pore-scale heterogeneity. It is believed that pore connectivity, size and shape of the pores, rock fabric, and amount of cement strongly affect the flowing fraction of the pore structure measured experimentally from the tracer tests conducted on the carbonate rock types.

While a number of other approaches may be utilized to determine the flowing fraction, two approaches will be presented to estimate the flowing fraction of the different rock types used. However, is also envisioned that any model that accounts for or may be used to determine the flowing fraction may be adapted for use in accordance with the methods of the present disclosure.

Coats and Smith Model Approach:

The Coats and Smith (1964) capacitance model is proposed for single phase dispersion in most of carbonate pore classes. The model equations are derived in differential form as given in Eqs. 4a and 4b below.

$$D\frac{\partial^2 C}{\partial X^2} - v\frac{\partial C}{\partial X} = f\frac{\partial C}{\partial t} + (1-f)\frac{\partial C^*}{\partial t} \qquad 4a$$

$$(1-f)\frac{\partial C^*}{\partial t} = M(C - C^*) \qquad 4b$$

Where C is the tracer concentration in the flowing stream, C* is the tracer concentration in the stagnant volume, D is the dispersion coefficient, f is the flowing fraction of the pore volume, and M is the mass transfer coefficient, and v is the interstitial velocity.

The initial condition is defined by Eq. 4c:

$$C(x,0)=0, \text{ for } x \geq 0 \qquad 4c$$

The boundary conditions are defined by Eqs. 4d and 4e:

$$x=C, vC_0=vC-D(\partial C/\partial x) \qquad 4d$$

$$x\to\infty, C(\infty,t)=0 \qquad 4e$$

The differential equations are solved and the model parameters (dispersion coefficient, flowing fraction of the pore volume, and mass transfer coefficient) are then obtained by fitting the model solution with the experimental data. Table 5 summarizes the parameters estimated from Coats and Smith model. Indiana Limestone carbonate rock type shows the highest flowing fraction while the Edwards White shows the lowest flowing fraction of the pore volume.

TABLE 5

Estimated Parameters from Coats and Smith Model

| Rock Type | Flowing Fraction f | Dispersion Coefficient D, $cm^2$/sec | Mass Transfer Coefficient M, cm/s |
|---|---|---|---|
| Indiana Limestone | 0.98 | 4.93E−02 | — |
| Edwards Yellow | 0.78 | 9.15E−02 | 8.04E−04 |
| Austin Chalk | 0.82 | 5.61E−02 | 2.18E−04 |
| Winterset Limestone | 0.58 | 7.05E−02 | 4.04E−04 |
| Pink Desert | 0.52 | 9.42E−02 | 8.36E−05 |
| Edwards White | 0.49 | 1.74E−02 | 9.01E−05 |

Experimental Approach

In this approach, the flowing fraction is defined as the cumulative pore volume injected corresponding to the normalized tracer concentration of $C/C_0=0.5$. In other words, this approach depends on how much the tracer concentration profile for the carbonate rock type deviates from the symmetrical profile around 1 PV injected. It was found that the flowing fraction estimated from the experimentally approach is better to quantify the magnitude of pore-scale heterogeneity (this finding will be discussed in greater detail in the next section). Table 6 shows the flowing fraction and the corresponding magnitude of pore-scale heterogeneity for the carbonate rock types used.

TABLE 6

Flowing Fraction and Magnitude of Heterogeneity for Different Carbonate Rock Types

| Rock Type | Flowing Fraction (f) |
| --- | --- |
| Indiana Limestone | 1 |
| Edwards Yellow | 0.91 |
| Austin Chalk | 0.92 |
| Winterset Limestone | 0.63 |
| Pink Desert | 0.75 |
| Edwards White | 0.53 |

Use of Tracer Test to Predict the PVBT for Carbonate Rocks

Figure 7:
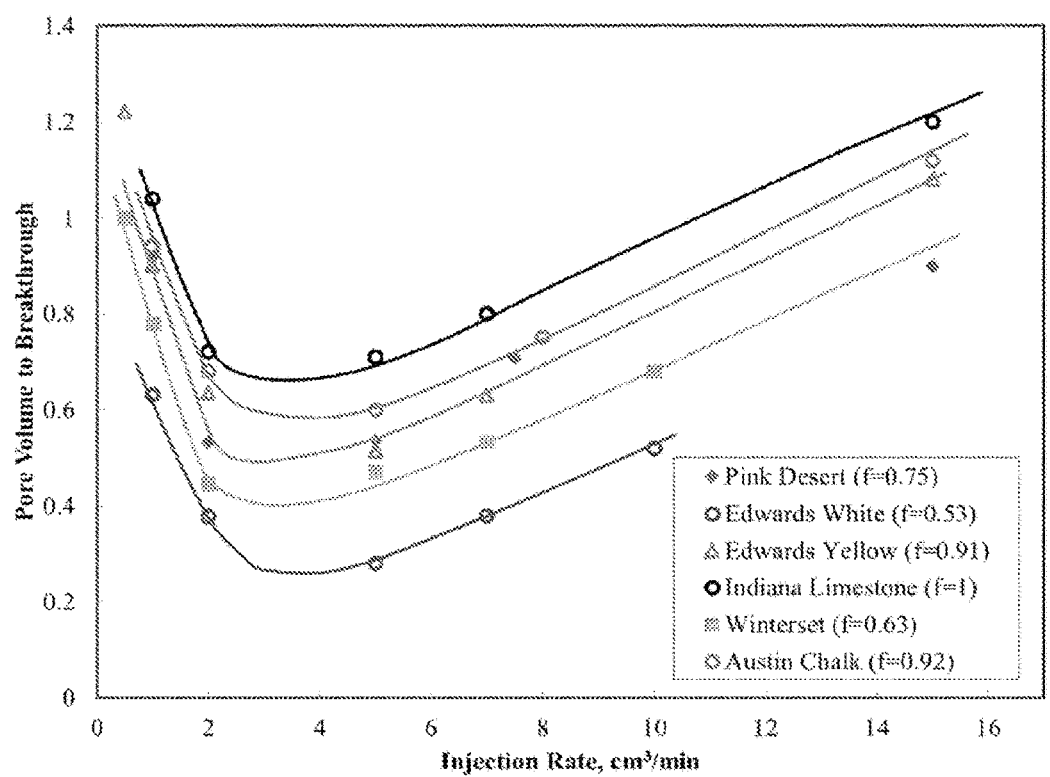
FIG. 7 illustrates the pore volume to breakthrough of an acid stimulating fluid as a function of injection rate for different carbonate rock types.

FIG. 7 shows the effect of the observed flowing fraction on the pore volume to breakthrough (PVBT) for a 15% solution of hydrochloric acid at different injection rates and at 150° F. (66° C.). For carbonate rock types of higher magnitude of pore-scale heterogeneity, the acid dissolves less rock overall than when compared to rock of low magnitude heterogeneity, such as Indiana limestone rock type (f=1), which leads to a lower PVBT. For example, the acid pore volumes to breakthrough for Edwards White carbonate rock type (f=0.53), ranging from 0.6 to 0.38, were observed to be less compared to Indiana limestone carbonate rock type (f=1) with PVBT ranging from 1.4 to 0.82. Acid pore volume to breakthrough is influenced by how fast the wormhole propagates along the rock. Consequently, wormhole propagation may occur more rapidly in carbonate rocks of higher magnitude of pore-scale heterogeneity when compared to rocks of lower magnitude such as Indiana limestone (f=1).

At the extreme case, at high Da (low injection rates) in which the movement of the reaction front is suppressed by the transverse dispersion, face dissolution occurs. However, the change in the magnitude of the pore-scale heterogeneity should not affect the dissolution dynamics. For example, face dissolution occurs for Indiana limestone rock type (f=1) at low injection rates, while the acids produce wormholes in carbonate rock types having a lower flowing fraction (higher magnitude of pore-scale heterogeneity) at these rates.

Figure 8:
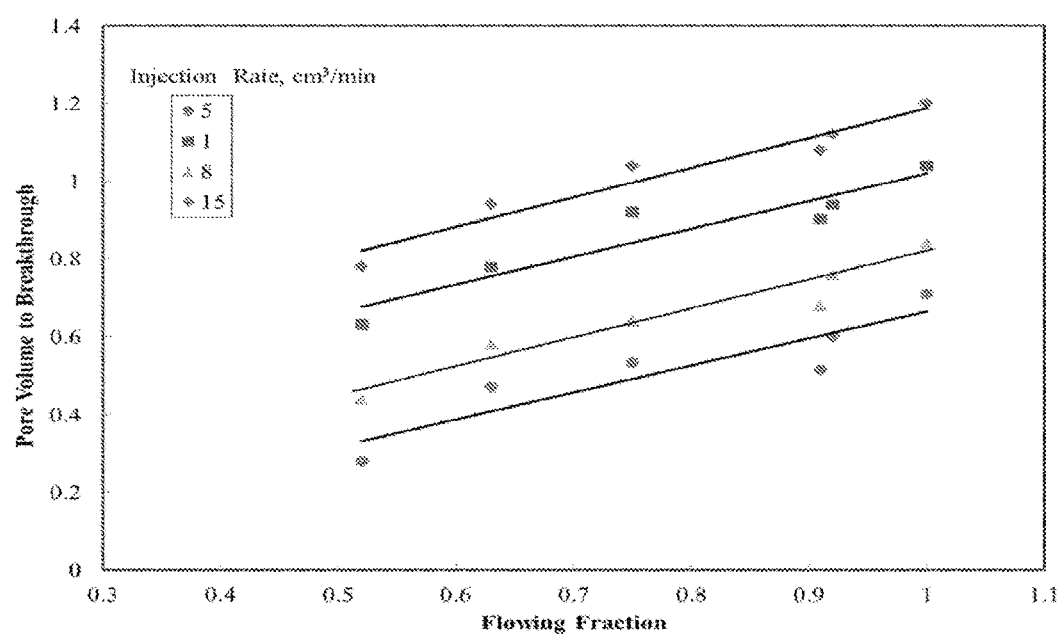
FIG. 8 illustrates the pore volume to breakthrough as a function of the flowing fraction at different injection rates for a selected number of rock types.

FIG. 8 shows the dependence of the PVBT on the flowing fraction at several acid injection rates. Note that pore volume to breakthrough decreases with the flowing fraction, and the lines for different acid injection rates are almost parallel (i.e., the slope is similar); therefore, the flowing fraction measured at one injection rate of the tracer can be used to calculate PVBT at a different acid injection rate. In this study, the flowing fraction was measured at a tracer injection rate of 5 cc/min, but is deemed accurate enough to adjust the PVBT for acid injection from 1-15 cc/min due to the linear relationship for the tested rock types. However, if it is desired to predict PVBT for acid injection at a rate different than that used for the tracer injection, the tracer injection may need to be repeated at rate closer to the desired acid injection rate.

For Indiana limestone carbonate rock type, the thin section shows a well-connected intergranular porosity, and the tracer concentration profile may be simulated by a high flowing fraction near 1 in C-S model. In other words, when the acid flows inside the core, it contacts high fraction of the rock, which leads to more acid consumption and, as a result, exhibits a high PVBT.

For other carbonate rock types where the magnitude of the pore-scale heterogeneity is relatively large, the thin sections often show a pore structure that is moldic-porosity dominated. Meaning that the pores are not well connected in the way that grain-dominated rock types such as in Indiana Limestone are. In addition, the non-reactive tracer fluid experiments show an early breakthrough and the tracer concentration profile can be simulated by adjusting the flowing fraction to less than unity. Consequently, as acid flows inside core samples of these carbonates, it contacts a small fraction of the rock, which leads to less acid consumption and lower PVBT curve.

Figure 9:
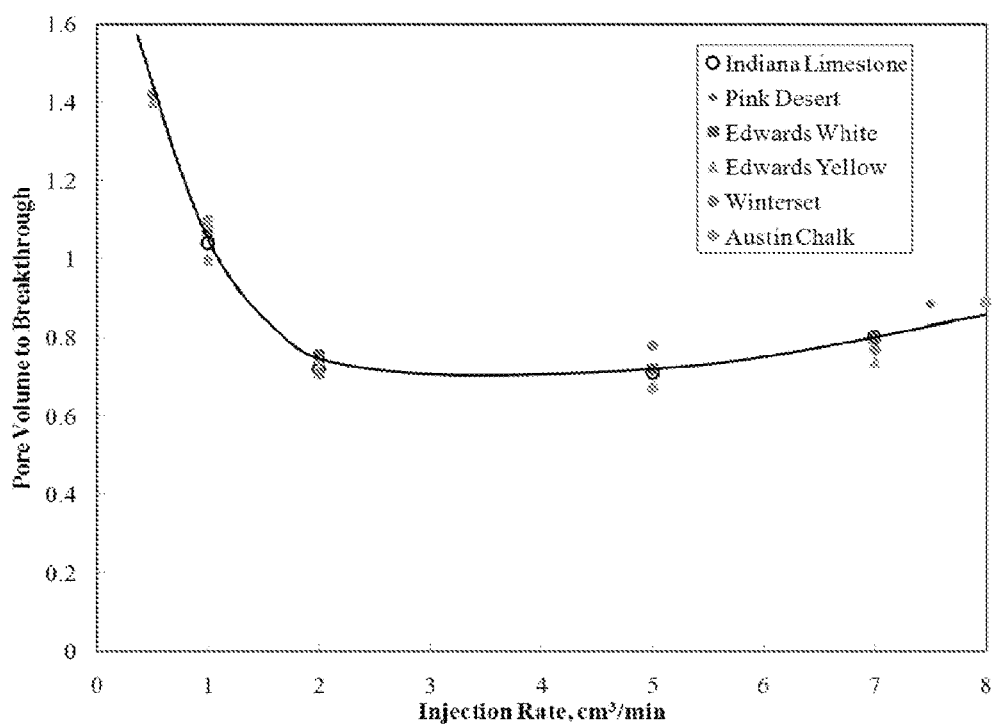
FIG. 9 illustrates the pore volume to breakthrough as a function of injection rate for different carbonate rock types after collapse.

To collapse the acid PVBT curves of different carbonate rock types into one single curve, the pore volume was adjusted by reducing the flowing fraction to correlate with that measured experimentally from the non-reactive tracer tests (Table 6). The PVBT for different rocks was then recalculated based on the flowing fraction such that the PVBT measurements for carbonate rock types having different magnitudes of pore-scale heterogeneity could be aligned on a single curve (FIG. 9). Because there may be overlapping behavior, the solution of differential equation Eq. 4 may not be unique, and therefore interpretation using "best fit" parameters to get the flowing fraction may be subjective. Further, one might expect intuitively that relatively homogenous media would be represented well, and strongly heterogeneous media to be represented poorly. Consequently, the flowing fraction used to collapse the PVBT curves was determined experimentally in an attempt to reduce any uncertainty.

Once the acid PVBT curves for the varied carbonate rock types were collapsed into a single acid PVBT curve, the effect of pore-scale heterogeneity on carbonate stimulation treatments could be correlated with the flowing fraction measured experimentally in the tracer tests. The results may be useful in the design of the matrix stimulation treatments in carbonates by allowing operators to increase the accuracy of estimates for injection pressure and stimulating fluid concentration for a calibrated rock type.

The results reveal a single curve for a wide range of carbonate rock types. This master curve may provide a means of estimating the entire pore volume to breakthrough curve from a single non-destructive tracer test (The tracer test is required to determine the flowing fraction). Thus, this master curve may eliminate the need for repetitive coreflood experimentation to determine the PVBT curve for the reservoir carbonate rock.

Few studies have been reported on the effect of carbonate heterogeneities at different scales on the carbonate stimulation treatments. On large scale, acid propagation along natural fracture networks and the resulting etching of the fracture may affect the acid propagation and the corresponding skin factor of an acidized naturally fractured well. Large-scale heterogeneities such as fractures, permeability variation, and laminations may be accounted for in matrix acidizing models by approximation using a gridding scheme. As discussed above, the pore-scale heterogeneity may have an effect on stimulation treatments, particularly in carbonate formations. However, to account for pore-scale heterogeneity, a gridding scheme finer than the pore scale may have to be employed, which may result in increased computational time and simulation cost.

The approaches presented in this disclosure may be used to account for such heterogeneity in matrix acidizing models. In the described models, the pore volume of each grid may be reduced by the flowing fraction measured experimentally from the tracer test conducted on core samples from the formation being acidized. In other words, the flowing porosity may be used in the models rather than the effective porosity as a method of accounting for the pore-scale heterogeneity. Furthermore, the tracer response can be used to initialize the porosity distribution model for the rock (single porosity, dual porosity, dual porosity and dual permeability) prior to acid injection.

Experiment wise, coreflood experiments on long reservoir cores may be useful in designing and predicting the success of acid stimulation treatments. However, such techniques may not always be practical. Instead, coreflood experiments may be performed on analogs for carbonate reservoirs as a substitute in some instances. It is expected that analog carbonate from formation outcrops will exhibit similar magnitudes of pore-scale heterogeneity and, in effect, exhibit similar properties during stimulation treatments. Consequently, the acid response to carbonate reservoirs may be predicted by knowing the flowing fraction measured experimentally from tracer tests performed on carbonates analogous to those in a given reservoir.

Flowing Fraction Relationship Derived from MICP and NMR Data

In this section, the flowing fraction and the petrophysical parameters obtained from MICP or NMR measurements are correlated. From this information, an adjusted PVBT may then be derived from the correlation, and the acid stimulation performance can be predicted; even in such cases where the use of data from non-reactive tracer coreflood tests are not available.

NMR Measurements

Figure 10:
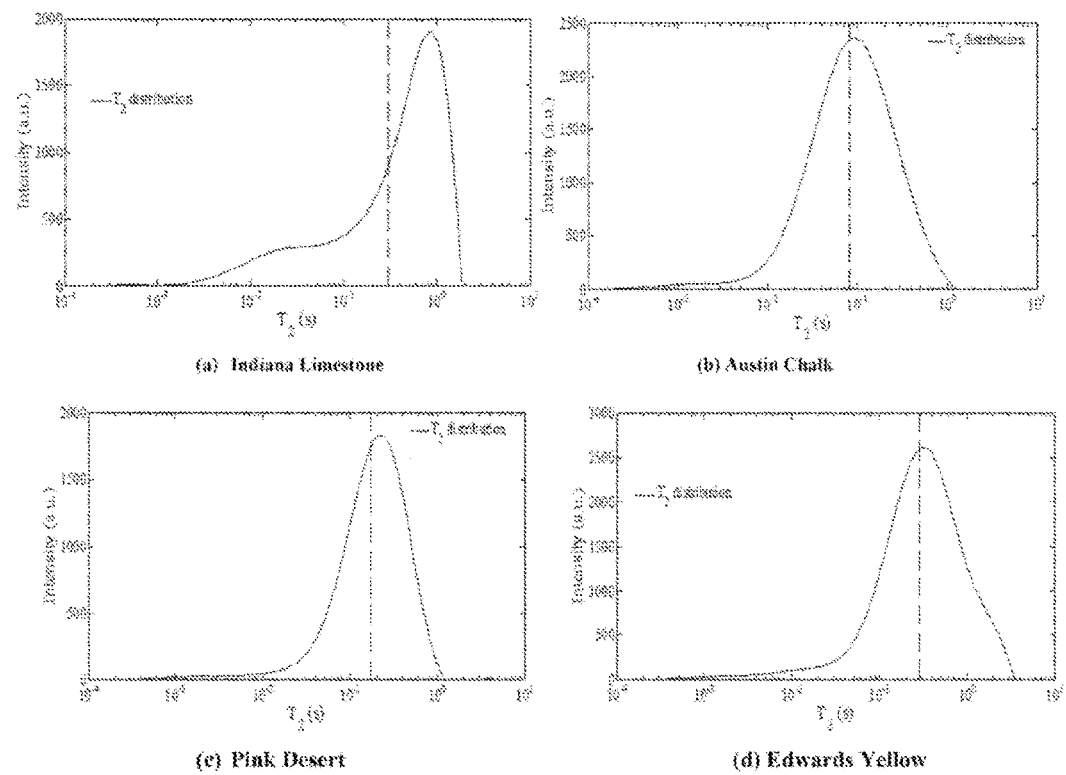
FIGS. 10 and 11 show the amplitude of NMR signal plotted against T2 time for the selected rock types.
Figure 11:
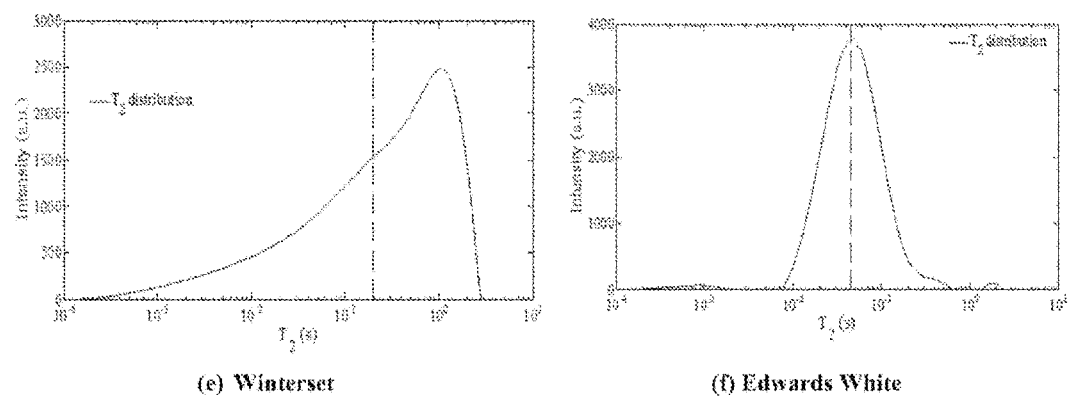

FIGS. 10 and 11 show NMR T2 distributions for the selected rock types. Each figure depicts the portion of porosity (ordinate) associated with the log T2 relaxation time (abscissa). The T2 relates to the pore size: the larger the T2 the larger the pore size. The area under the black T2 distribution curve is equal to the total NMR porosity.

With particular respect to FIG. 10, (a) shows the T2 distribution from NMR measurements for Indiana Limestone. The figure suggests bimodal pore system which indicates medium to large pores between the grains. FIG. 10 (b) shows the T2 distribution for Austin Chalk, which exhibits a large area under the T2 relaxation curve between 0.01 and 1 sec. This is the area of faster T2 relaxation time and indicates smaller pores between the grains as compared to Indiana limestone. FIGS. 10 (c) and (d) show the T2 distribution from NMR measurements of Pink Desert and Edwards Yellow carbonate rock types respectively, each demonstrating a unimodal pore system (often attributed to a pore structures dominated by moldic porosity).

Moving to FIG. 11, FIG. 11 (e) shows the T2 distribution from NMR measurements of the Winterset formation, which exhibits a broad bimodal pore system. The area of the slow T2 relaxation time corresponds to the presence of large moldic pores, while the area of the faster T2 relaxation time indicates the tight intercrystalline pores that connect the larger moldic pores. FIG. 11 (f) shows the T2 distribution from NMR measurements obtained from the sample of Edwards White formation that exhibits a T2 distribution curve that corresponds to the fast T2 relaxation time (around 40 msec), which may be produced by the microporosity within the micritized matrix.

The pore size for the rock samples can be obtained directly from T2 and the difference between the T2 distributions for the fully saturated and partially saturated cores indicates the mobility of the fluid for a given pressure drop. It may be observed that rocks with large pore sizes (large T2) and high fluid mobility in those pores (large unbound fluid volume) have a smaller PVBT.

MICP Measurements

High pressure mercury injection tests were performed on all carbonate rock types using the Micrometrics AutoPore IV 9520 mercury porosimeter. Mercury was injected at multiple pressures up to 60,000 psi. The volume of the mercury injected at each pressure increment was automatically recorded until the maximum pressure was achieved. The median pore throat diameter size is defined as the pore throat diameter at 50% of mercury intrusion during the experiment. Table 7 shows the median pore throat diameters for the carbonate rock types.

TABLE 7

Mercury Injection Capillary Pressure Results for Different Carbonate Rock Types

| Rock Type | Mercury Entry Pressure (psi) | Median Pore Throat Diameter (μm) |
|---|---|---|
| Indiana Limestone | 4.45 | 16.04 |
| Edwards Yellow | 12.69 | 6.95 |
| Austin Chalk | 33.90 | 1.64 |
| Winterset Limestone | 57.17 | 1.52 |
| Pink Desert | 18.15 | 6.44 |
| Edwards White | 67.49 | 1.11 |

Figure 12:
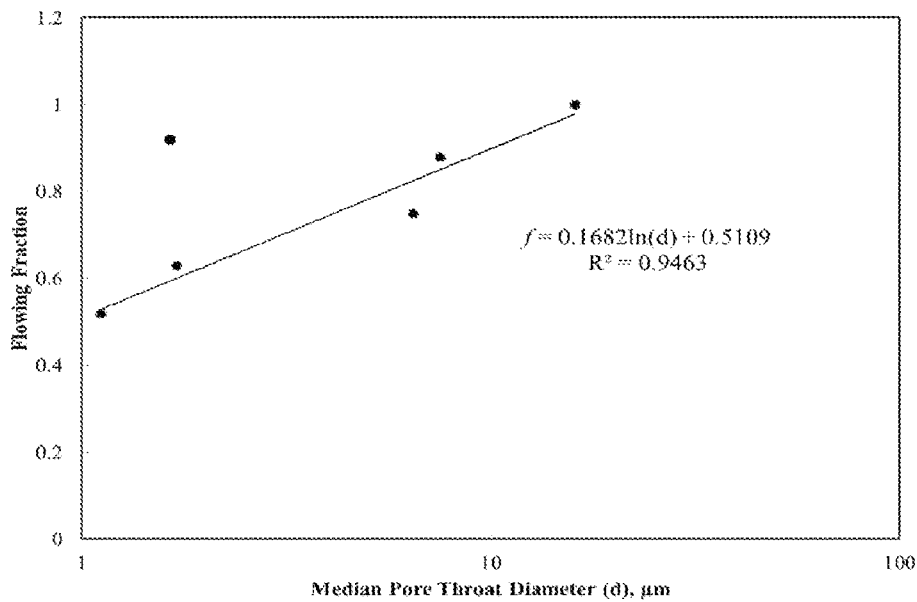
FIGS. 12 and 13 illustrate the correlation of the flowing fraction of a number of samples with other indicated physical measurements.

FIG. 12 shows a good linear correlation between the median pore throat diameter and the flowing fraction. The correlation suggests that the smaller the median pore throat diameter, the less connectivity between pores and thus the lower the flowing fraction.

Figure 13:
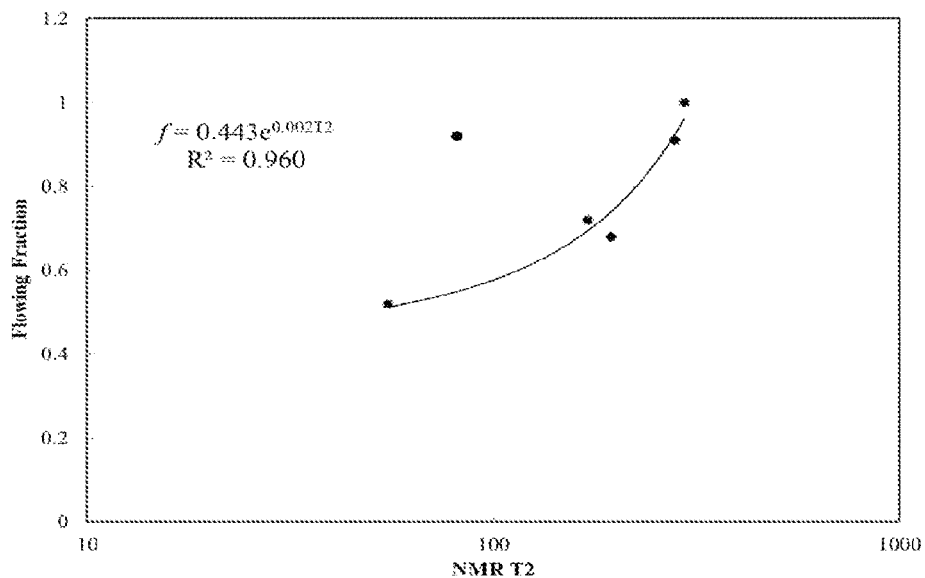

In some embodiments, it may be more useful to correlate a wire line log measured parameter (such as NMR T2) than laboratory measured parameter (such as median pore throat diameter) to the flowing fraction. FIG. 13 shows a good exponential correlation between the NMR T2 and the flowing fraction. The correlation suggests that the larger T2 (i.e. the larger pore size), the lower the flowing fraction for the carbonate rock type. Conversely, FIG. 16 shows a poor correlation between the effective to total porosity ratio and the flowing fraction. Effective porosity is estimated from routine core analysis, while the total porosity is estimated from NMR measurements, although the presented range of data is narrow and it may go beyond this range. For example, when considering a vugular carbonate rock type, the slope for the correlation may be negative, which means that the ratio of the effective porosity to total porosity may a less accurate method of estimating the flowing fraction. A possible outlier in the correlations is the Austin Chalk sample, which may be due to the microporosity in Austin Chalk carbonate rock type.

Example with an Non-Reactive Tracer Fluid that Simulates an Emulsified Stimulating Fluid Non-reactive tracer fluids may also be formulated to have similar characteristics as emulsified stimulating fluids and used to model the behavior of emulsified stimulating treatments without damaging the sample. In the following example, an acid solution was prepared by mixing HCl, deionized water, a corrosion inhibitor, and an inhibitor aid as shown in Table 8. The emulsifier was added to the diesel in a blender at 500 rpm. Next, the acid solution was added to diesel-emulsifier solution at high to moderate speed, and the emulsion was blended for 2 minutes at moderate to high speed

TABLE 8

Emulsified acid formulation

| | | |
|---|---|---|
| Deionized water | 265.5 | gal/1000 |
| 36 wt % HCl | 419.5 | gal/1000 |
| Corrosion inhibitor | 5 | gal/1000 |
| Inhibitor Aid | 10 | gal/1000 |
| Emulsifier | 6 | gal/1000 |
| Base Oil | 294 | gal/1000 |

Figure 14:
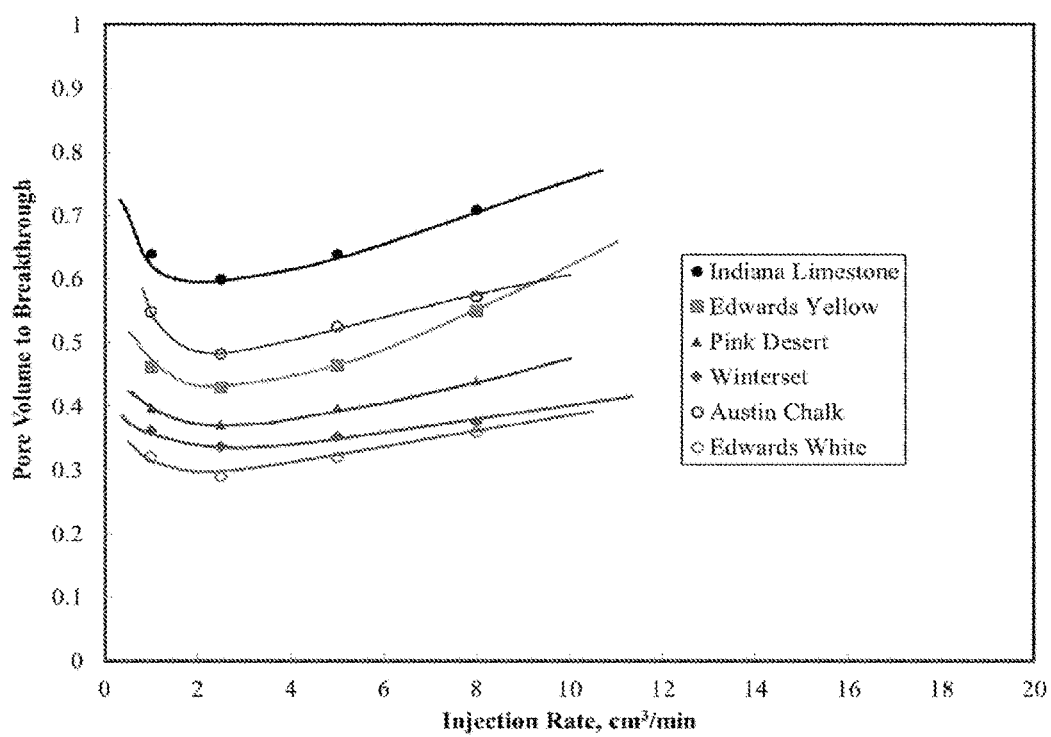
FIG. 14 illustrates the pore volume to breakthrough as a function of the flowing fraction at different injection rates of an emulsified stimulating fluid for a selected number of rock types.

PVBT was measured for the emulsified acid using the substantially same protocol described above for the pore volume to breakthrough experiments with acid stimulating fluid experiments and setup shown in FIG. 3. The PVBT curves for the emulsified acid are plotted in FIG. 14. Emulsified acid experiments were conducted at 150° F. at injection rates of 1, 2.5, 5, and 8 cm3/min.

Next, a non-reactive tracer fluid was formulated to model the emulsified acid by preparing a polymer solution of acrylamide having a similar rheological profile to the emulsified acid as shown in Table 9.

TABLE 9

Viscosity comparison between emulsified acid and polymer solutions.

| Fluid System | Power Law Consistency Index (k) (mPa · sn) | Power Law Index (n) |
|---|---|---|
| Emulsified Acid | 81.87 | 0.734 |
| 0.2 vol % Polymer | 98.30 | 0.710 |

Figure 15:
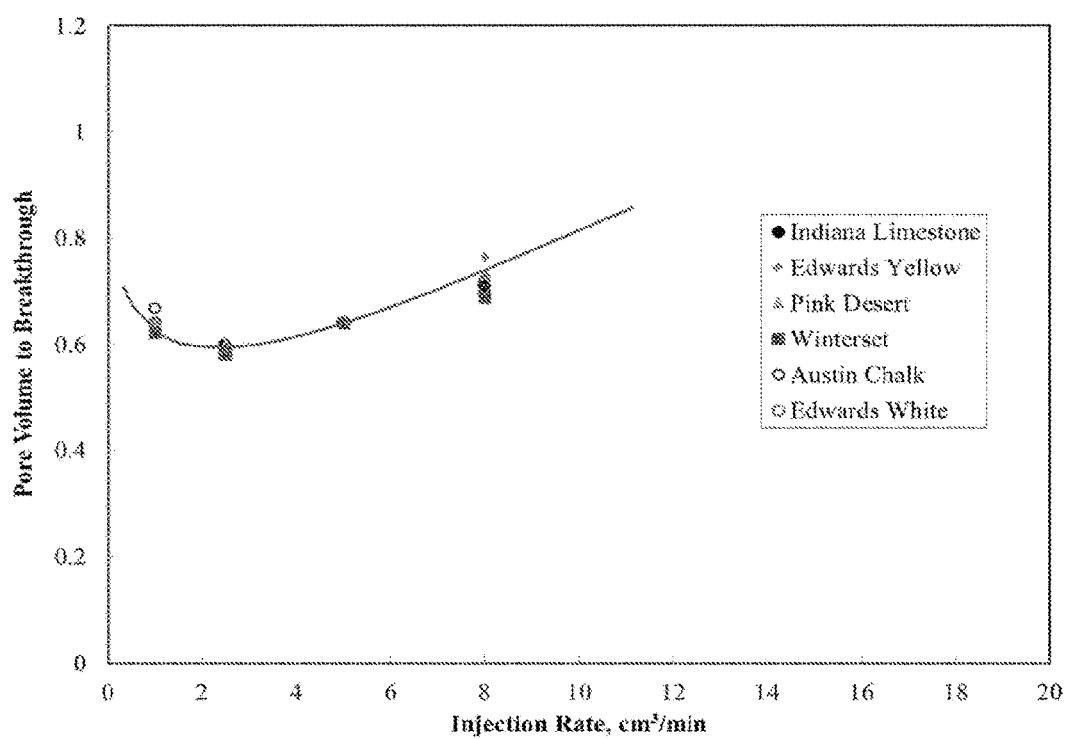
FIG. 15 illustrates the pore volume to breakthrough curves for an emulsified stimulating fluid in different carbonate rock types after collapse.

Tracer tests using the polymer solution were conducted. The difference in the flowing fractions was determined for non-reactive tracer fluids as shown in Table 10 and used to collapse the PVBT curves of the rock types onto a single adjusted PVBT curve for the series of carbonate samples as shown in FIG. 15. It is also noted that the flowing fraction dated measured with a polymer base fluid (Table 10 below) provided a better fit than when adjusting the PVBT using the flowing fraction measured with a plain base fluid.

TABLE 10

Flowing fraction for non-reactive tracer fluid formulations

| Rock Type | Flowing fraction with Polymer | Flowing Fraction for Salt Solution Alone |
|---|---|---|
| Indiana Limestone | 0.99 | 1 |
| Edwards Yellow | 0.72 | 0.91 |
| Pink Desert | 0.61 | 0.75 |
| Austin Chalk | 0.82 | 0.92 |
| Winterset Limestone | 0.58 | 0.63 |
| Edwards White | 0.5 | 0.52 |

However, while the flowing fraction is accurately described as a single value in this example of a viscosified fluid, depending on the rheological character of the fluid (shear thinning, shear thickening, etc.), it is envisioned that in some instances the flowing fraction may be represented, not as a single value, but as a function that varies with a number of physical parameters including temperature, injection pressure, injection rate, pH, surfactant concentration, or chemical reactions occurring within the fluid or between the rock and the fluid.

While many modeling and experimental studies have focused on the effect of large- and medium-scale heterogeneities on carbonate stimulation treatments, no rigorous studies have been reported on the effect of pore-scale heterogeneity on wormhole dissolution pattern or the PVBT for stimulating fluids. Non-destructive methods in accordance with embodiments of the present disclosure may reduce the investment and time required for stimulation operations, because the time and expense required to retrieve multiple core samples will be reduced. The use of non-destructive testing techniques may also find utility for scenarios in which core sample are in short supply or when tests with acids on large blocks cannot be carried out due to safety concerns.

While the disclosure has provided specific and detailed descriptions to various embodiments, the same is to be considered as illustrative and not restrictive in character. Only certain example embodiments have been shown and described. Those skilled in the art will appreciate that many modifications are possible in the example embodiments without materially departing from the disclosure. Moreover, embodiments described herein may be practiced in the absence of any element that is not specifically disclosed herein. Accordingly, all such modifications are intended to be included within the scope of this disclosure as defined in the following claims.

In reading the claims, it is intended that when words such as "a," "an," "at least one," or "at least one portion" are used there is no intention to limit the claim to only one item unless specifically stated to the contrary in the claim. When the language "at least a portion" and/or "a portion" is used the item can include a portion and/or the entire item unless specifically stated to the contrary. In the claims, means-plus-function clauses are intended to cover the structures described herein as performing the recited function and not only structural equivalents, but also equivalent structures. For example, although a nail and a screw may not be structural equivalents in that a nail employs a cylindrical surface to secure wooden parts together, whereas a screw employs a helical surface, in the environment of fastening wooden parts, a nail and a screw may be equivalent structures. It is the express intention of the applicant not to invoke 35 U.S.C. § 112, paragraph 6 for any limitations of any of the claims herein, except for those in which the claim expressly uses the words 'means for' together with an associated function.

What is claimed:

1. A method, comprising:
   quantifying a pore-scale heterogeneity of a porous medium, wherein the pore-scale heterogeneity is an overall variance of pore-size distribution;
   determining an adjusted pore volume to breakthrough based on the pore scale heterogeneity;
   using the pore-scale heterogeneity and the adjusted pore volume to breakthrough to design a stimulating fluid treatment for the porous medium; and
   performing the stimulating fluid treatment by injecting a stimulating fluid into a subterranean formation.

2. The method of claim 1, wherein quantifying the pore-scale heterogeneity of a porous medium further comprises at least one of determining a flowing fraction or a Lorenz coefficient.

3. The method of claim 1, wherein quantifying the pore-scale heterogeneity of a porous medium further comprises determining a flowing fraction, wherein the flowing fraction is defined as the cumulative pore volume injected corresponding to a normalized tracer concentration at $C/C_0=0.5$, wherein C is a tracer concentration in core effluent and $C_0$ is a tracer concentration at a core inlet.

4. The method of claim 1, wherein quantifying the pore-scale heterogeneity of a porous medium comprises injecting a non-reactive tracer fluid through the porous medium.

5. The method of claim 1, wherein quantifying the pore-scale heterogeneity of a porous medium comprises at least one of collecting a NMR T2 log of the porous medium using an NMR tool, collecting a log of the porous medium using a formation micro-imager, or measuring a sample of the porous medium using mercury injection capillary pressure, wherein T2 is a transverse relaxation time.

6. The method of claim 1, further comprising analyzing the mineralogy of the porous medium using x-ray fluorescence measurements.

7. The method of claim 1, wherein determining an adjusted pore volume to breakthrough comprises correlating the pore-scale heterogeneity of a porous medium to the pore volume to breakthrough by a computerized calculation.

8. The method of claim 1, wherein the porous medium is a core taken from a subterranean formation.

9. A method, comprising:
injecting a non-reactive tracer fluid through a porous medium;
measuring a flowing fraction;
estimating an adjusted pore volume to breakthrough based on the measured flowing fraction;
designing a stimulating fluid treatment for the porous medium; and
performing the stimulating fluid treatment by injecting a stimulating fluid into a subterranean formation,
wherein the non-reactive tracer comprises a fluid that contains a detectable species.

10. The method of claim 9, wherein the non-reactive tracer fluid is at least one of an aqueous fluid, a gelled fluid, an emulsion, an invert emulsion, or a foam.

11. The method of claim 9, further comprising using a computer to correlate the flowing fraction to the pore volume to breakthrough.

12. The method of claim 9, wherein the porous medium is a formation between at least two wellbores.

13. The method of claim 9, wherein injecting a non-reactive tracer fluid through a porous medium comprises injecting the non-reactive tracer fluid through a core taken from a subterranean formation to be treated and returned to the surface.

14. The method of claim 9, wherein designing the stimulation treatment for the porous medium comprises selecting at least one of: the stimulating fluid, the concentration of the stimulating fluid, and the injection pressure of the stimulating fluid into the porous medium.

15. The method of claim 9, wherein measuring a flowing fraction further comprises at least one measurement selected from a group consisting of measuring a NMR T2 response from a sample, collecting a log of the porous medium using an NMR tool, collecting a log of the porous medium using a formation micro-imager, collecting a micro CT scan of a sample, collecting a micro CT log of a well, and imaging using a scanning electron microscope, wherein T2 is a transverse relaxation time.

16. The method of claim 9, wherein the porous medium is a core sample.

17. A method, comprising:
determining a pore volume to breakthrough for a first porous medium having a first type of porosity;
calculating a flowing fraction for a second porous medium having a second type of porosity;
determining an adjusted pore volume to breakthrough for the second porous medium by adjusting the pore volume to breakthrough for the first porous medium using the calculated flowing fraction for the second porous medium;
using the pore volumes to breakthrough for the first and second porous media to design a stimulation fluid treatment; and
performing the designed stimulation treatment by injecting a stimulation fluid into a subterranean formation,
wherein the first and second type of porosity comprises interparticle porosity, microporosity, vuggy porosity and moldic porosity.

18. The method of claim 17, wherein calculating a flowing fraction for the second porous medium comprises at least one measurement selected from a group consisting of measuring a T2 response from a sample by NMR, collecting a log of the porous medium using an NMR tool, collecting a log of the porous medium using a formation micro-imager, collecting a micro CT scan of a sample, collecting a micro CT log of a well, and imaging using a scanning electron microscope.

19. The method of claim 17, further comprising designing a stimulation treatment for the second porous medium based on the adjusted pore volume to breakthrough determined.

20. The method of claim 19, wherein the designing a stimulation treatment comprises selecting at least one of: the stimulating fluid, the concentration of the stimulating fluid, and the injection pressure of the stimulating fluid into the porous medium.

\* \* \* \* \*